(12) United States Patent
Balteanu et al.

(10) Patent No.: US 10,985,703 B2
(45) Date of Patent: *Apr. 20, 2021

(54) FAST ENVELOPE TRACKING SYSTEMS FOR POWER AMPLIFIERS

(71) Applicant: Skyworks Solutions, Inc., Irvine, CA (US)

(72) Inventors: Florinel G. Balteanu, Irvine, CA (US); Serge Francois Drogi, Flagstaff, AZ (US); Sabah Khesbak, Irvine, CA (US); Hardik Bhupendra Modi, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/682,410

(22) Filed: Nov. 13, 2019

(65) Prior Publication Data

US 2020/0259458 A1 Aug. 13, 2020

Related U.S. Application Data

(63) Continuation of application No. 16/011,945, filed on Jun. 18, 2018, now Pat. No. 10,516,368.

(Continued)

(51) Int. Cl.
*H03F 1/02* (2006.01)
*H03F 3/19* (2006.01)
(Continued)

(52) U.S. Cl.
CPC .......... *H03F 1/0227* (2013.01); *H03F 3/189* (2013.01); *H03F 3/19* (2013.01); *H03F 3/245* (2013.01);
(Continued)

(58) Field of Classification Search
CPC .......... H03F 1/0227; H03F 3/19; H03F 3/245; H03F 3/189; H03F 2200/451; H03F 2200/102; H03F 2201/3227
(Continued)

(56) References Cited

U.S. PATENT DOCUMENTS

| 5,264,752 A | 11/1993 | Savicki |
| 6,407,634 B1 | 6/2002 | Staudinger et al. |

(Continued)

FOREIGN PATENT DOCUMENTS

| GB | 2398648 | 8/2004 |
| GB | 2409115 | 11/2006 |

(Continued)

OTHER PUBLICATIONS

Blanken et al. "A 50MHz Bandwidth Multi-Mode PA Supply Modulator for GSM, Edge and UMTS Application," IEEE Radio Frequency Integrated Circuits Symposium, Apr. 2008, pp. 401-404.

(Continued)

*Primary Examiner* — Hieu P Nguyen
(74) *Attorney, Agent, or Firm* — Knobbe, Martens, Olson & Bear, LLP

(57) ABSTRACT

Fast envelope tracking systems are provided herein. In certain embodiments, an envelope tracking system for a power amplifier includes a switching regulator and a differential error amplifier configured to operate in combination with one another to generate a power amplifier supply voltage for the power amplifier based on an envelope of a radio frequency (RF) signal amplified by the power amplifier. The envelope tracking system further includes a differential envelope amplifier configured to amplify a differential envelope signal to generate a single-ended envelope signal that changes in relation to the envelope of the RF signal. Additionally, the differential error amplifier generates an (Continued)

output current operable to adjust a voltage level of the power amplifier supply voltage based on comparing the single-ended envelope signal to a reference signal.

20 Claims, 10 Drawing Sheets

Related U.S. Application Data

(60) Provisional application No. 62/522,956, filed on Jun. 21, 2017.

(51) Int. Cl.
*H03F 3/189* (2006.01)
*H03F 3/24* (2006.01)

(52) U.S. Cl.
CPC .. *H03F 2200/102* (2013.01); *H03F 2200/451* (2013.01); *H03F 2201/3227* (2013.01)

(58) Field of Classification Search
USPC .............................. 330/297, 127, 134, 279
See application file for complete search history.

(56) References Cited

U.S. PATENT DOCUMENTS

| | | | |
|---|---|---|---|
| 6,583,664 B2 | 6/2003 | Mathe et al. |
| 6,646,501 B1 | 11/2003 | Wessel |
| 6,914,487 B1 | 7/2005 | Doyle et al. |
| 7,482,869 B2 | 1/2009 | Wilson |
| 7,761,065 B2 | 7/2010 | Drogi et al. |
| 8,000,409 B2 | 8/2011 | Chan et al. |
| 8,094,764 B2 | 1/2012 | Lackey |
| 8,183,917 B2 | 5/2012 | Drogi et al. |
| 8,587,377 B2 | 11/2013 | Khesbak et al. |
| 8,610,499 B2 | 12/2013 | Royer |
| 8,620,238 B2 | 12/2013 | Chan et al. |
| 8,680,833 B2 | 3/2014 | Wilson |
| 8,731,496 B2 | 5/2014 | Drogi et al. |
| 8,803,605 B2 | 8/2014 | Fowers et al. |
| 8,947,162 B2 | 2/2015 | Wimpenny et al. |
| 8,952,753 B2 | 2/2015 | Tournatory |
| 9,019,011 B2 | 4/2015 | Hietala et al. |
| 9,065,385 B2 | 6/2015 | Gorbachov |
| 9,066,368 B2 | 6/2015 | Lorenz et al. |
| 9,225,362 B2 * | 12/2015 | Drogi .................. H04B 1/0458 |
| 9,445,371 B2 | 9/2016 | Khesbak et al. |
| 9,473,023 B2 | 10/2016 | Vannorsdel et al. |
| 9,571,048 B2 | 2/2017 | Ortiz |
| 9,667,196 B2 | 5/2017 | Midya |
| 9,668,215 B2 | 5/2017 | Balteanu et al. |
| 9,748,912 B2 | 8/2017 | Choi et al. |
| 9,793,861 B1 * | 10/2017 | Somerville ............. H03F 3/195 |
| 9,876,473 B2 | 1/2018 | Khesbak et al. |
| 10,516,368 B2 | 12/2019 | Balteanu et al. |
| 10,615,757 B2 | 4/2020 | Balteanu et al. |
| 2002/0030543 A1 | 3/2002 | French et al. |
| 2002/0101912 A1 | 8/2002 | Phelts et al. |
| 2003/0155978 A1 | 8/2003 | Pehlke |
| 2004/0083409 A1 | 4/2004 | Rozenblit et al. |
| 2004/0198271 A1 | 10/2004 | Kang |
| 2005/0064830 A1 | 3/2005 | Grigore |
| 2005/0070233 A1 | 3/2005 | Sowlati |
| 2005/0110562 A1 | 5/2005 | Robinson et al. |
| 2006/0119425 A1 | 6/2006 | Phillips et al. |
| 2007/0210771 A1 | 9/2007 | Wilson et al. |
| 2007/0249304 A1 | 10/2007 | Snelgrove et al. |
| 2007/0273449 A1 | 11/2007 | Wilson |
| 2007/0279019 A1 | 12/2007 | Wilson |
| 2008/0238387 A1 | 10/2008 | Schmeller et al. |
| 2009/0004981 A1 | 1/2009 | Eliezer et al. |
| 2009/0016086 A1 | 1/2009 | Huynh et al. |
| 2009/0097591 A1 | 4/2009 | Kim |
| 2009/0128236 A1 | 5/2009 | Wilson |
| 2009/0289720 A1 | 11/2009 | Takinami et al. |
| 2009/0302941 A1 | 12/2009 | Wimpenny |
| 2011/0058601 A1 | 3/2011 | Kim et al. |
| 2012/0139641 A1 | 6/2012 | Kaczman et al. |
| 2012/0146731 A1 | 6/2012 | Khesbak |
| 2012/0194274 A1 | 8/2012 | Fowers et al. |
| 2012/0200354 A1 | 8/2012 | Ripley et al. |
| 2012/0201065 A1 | 8/2012 | Nate et al. |
| 2012/0269240 A1 | 10/2012 | Balteanu et al. |
| 2012/0326783 A1 | 12/2012 | Mathe et al. |
| 2013/0034139 A1 | 2/2013 | Khlat et al. |
| 2013/0109441 A1 | 5/2013 | Lorenz et al. |
| 2013/0109442 A1 | 5/2013 | Dakshinamurthy et al. |
| 2013/0116017 A1 | 5/2013 | Zhang et al. |
| 2013/0127548 A1 | 5/2013 | Popplewell et al. |
| 2013/0200864 A1 | 8/2013 | Huang et al. |
| 2013/0207731 A1 | 8/2013 | Balteanu |
| 2013/0217345 A1 | 8/2013 | Balteanu et al. |
| 2013/0231069 A1 | 9/2013 | Drogi |
| 2013/0293210 A1 | 11/2013 | Smith et al. |
| 2014/0049321 A1 | 2/2014 | Gebeyehu et al. |
| 2014/0155127 A1 | 6/2014 | Dakshinamurthy et al. |
| 2014/0213204 A1 | 7/2014 | Balteanu et al. |
| 2014/0218109 A1 | 8/2014 | Wimpenny |
| 2014/0232458 A1 | 8/2014 | Arno |
| 2014/0240052 A1 | 8/2014 | Mao |
| 2014/0300334 A1 | 10/2014 | Popplewell et al. |
| 2014/0306763 A1 | 10/2014 | Hong et al. |
| 2014/0312974 A1 | 10/2014 | Khesbak et al. |
| 2014/0312977 A1 | 10/2014 | Kaczman et al. |
| 2014/0361830 A1 | 12/2014 | Mathe et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0105033 A1 | 4/2015 | Modi et al. |
| 2015/0155834 A1 | 6/2015 | Ripley et al. |
| 2015/0180421 A1 | 6/2015 | Balteanu et al. |
| 2015/0188432 A1 | 7/2015 | Vannorsdel et al. |
| 2015/0236654 A1 | 8/2015 | Jiang et al. |
| 2015/0270806 A1 | 9/2015 | Wagh et al. |
| 2015/0326184 A1 | 11/2015 | Balteanu et al. |
| 2015/0365053 A1 | 12/2015 | Wimpenny |
| 2016/0006396 A1 | 1/2016 | Wimpenny |
| 2016/0006397 A1 | 1/2016 | Wimpenny |
| 2016/0036389 A1 | 2/2016 | Balteanu et al. |
| 2016/0050629 A1 | 2/2016 | Khesbak et al. |
| 2016/0094192 A1 | 3/2016 | Khesbak et al. |
| 2016/0099742 A1 | 4/2016 | Ripley et al. |
| 2016/0118943 A1 | 4/2016 | Khesbak |
| 2016/0156317 A1 | 6/2016 | Inoue |
| 2016/0174153 A1 | 6/2016 | Balteanu et al. |
| 2016/0248381 A1 | 8/2016 | Yang |
| 2016/0261239 A1 | 9/2016 | Khesbak et al. |
| 2016/0336901 A1 | 11/2016 | Khesbak et al. |
| 2017/0005625 A1 | 1/2017 | Zhu et al. |
| 2017/0033747 A1 | 2/2017 | Balteanu et al. |
| 2017/0047953 A1 | 2/2017 | Balteanu et al. |
| 2017/0093347 A1 | 3/2017 | Zhu et al. |
| 2017/0093505 A1 | 3/2017 | Ripley et al. |
| 2017/0179889 A1 | 6/2017 | Khesbak et al. |
| 2017/0195972 A1 | 7/2017 | Drogi et al. |
| 2017/0223632 A1 | 8/2017 | Balteanu et al. |
| 2018/0034416 A1 | 2/2018 | Duncan et al. |
| 2018/0076772 A1 | 3/2018 | Khesbak et al. |
| 2018/0234060 A1 | 8/2018 | Langer et al. |
| 2018/0287572 A1 | 10/2018 | Oishi |
| 2018/0331659 A1 | 11/2018 | Khesbak et al. |
| 2018/0375483 A1 | 12/2018 | Balteanu et al. |
| 2019/0222178 A1 | 7/2019 | Khlat |
| 2019/0253023 A1 | 8/2019 | Yang |
| 2020/0212855 A1 | 7/2020 | Noguchi |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |

(56) References Cited

FOREIGN PATENT DOCUMENTS

| WO | WO 2009/127739 | 10/2009 |
|---|---|---|
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

\* cited by examiner

FAST ENVELOPE TRACKING SYSTEMS FOR POWER AMPLIFIERS

CROSS-REFERENCE TO RELATED APPLICATIONS

This application is a continuation of U.S. application Ser. No. 16/011,945, filed Jun. 19, 2018 and titled "FAST ENVELOPE TRACKING SYSTEMS FOR POWER AMPLIFIERS," which claims the benefit of priority under 35 U.S.C. § 119 of U.S. Provisional Patent Application No. 62/522,956, filed Jun. 21, 2017 and titled "FAST ENVELOPE TRACKING SYSTEMS FOR POWER AMPLIFIERS," each of which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 450 MHz to about 6 GHz for certain communications standards.

SUMMARY

In certain embodiments, the present disclosure relates to mobile device. The mobile device includes a transceiver configured to generate a radio frequency transmit signal, a front end circuit including a power amplifier configured to amplify the radio frequency transmit signal, and a power management circuit including an envelope tracker configured to generate a power amplifier supply voltage of the power amplifier. The envelope tracker includes a differential envelope amplifier configured to amplify a differential envelope signal to generate a single-ended envelope signal that changes in relation to an envelope of the radio frequency transmit signal, and a differential error amplifier configured to generate an output current based on comparing the single-ended envelope signal to a reference signal. The output current is operable to adjust a voltage level of the power amplifier supply voltage.

In some embodiments, the differential envelope amplifier includes an amplification circuit configured to amplify the differential envelope signal, and a common mode feedback circuit operable to compensate the amplification circuit for a common mode error arising from a common mode voltage of the differential envelope signal. According to a number of embodiments, the amplification circuit includes a first differential input configured to receive the differential envelope signal and a second differential input configured to receive a differential compensation signal from the common mode feedback circuit. In accordance with several embodiments, the common mode feedback circuit is configured to provide feedback from an output of the amplification circuit to the second differential input of the amplification circuit. According to various embodiments, the envelope tracker further includes a differential input filter configured to filter the differential envelope signal prior to amplification by the amplification circuit.

In a number of embodiments, the differential error amplifier includes a first input configured to receive a reference voltage and a second input configured to receive the single-ended envelope signal, and the second input has an input impedance this is lower than an input impedance of the first input. In accordance with various embodiments, the input impedance of the second input is at least ten times lower than the input impedance of the first input.

In several embodiments, the envelope tracker further includes a switching regulator configured to generate a regulated voltage, and a combiner configured to combine the regulated voltage and the output current to thereby generate the power amplifier supply voltage. In accordance with a number of embodiments, the differential error amplifier is further configured to generate a sense signal that tracks the output current, the switching regulator configured to generate the regulated voltage based on the sense signal.

In certain embodiments, the present disclosure relates to an envelope tracking system. The envelope tracking system includes a power amplifier configured to amplify a radio frequency signal, and an envelope tracker configured to generate a power amplifier supply voltage of the power amplifier. The envelope tracker includes a differential envelope amplifier configured to amplify a differential envelope signal to generate a single-ended envelope signal that changes in relation to an envelope of the radio frequency signal, and a differential error amplifier configured to generate an output current based on comparing the single-ended envelope signal to a reference signal. The output current is operable to adjust a voltage level of the power amplifier supply voltage.

In some embodiments, the differential envelope amplifier includes an amplification circuit configured to amplify the differential envelope signal, and a common mode feedback circuit operable to compensate the amplification circuit for a common mode error arising from a common mode voltage of the differential envelope signal. According to a number of embodiments, the envelope tracker further includes a differential input filter configured to filter the differential envelope signal prior to amplification by the amplification circuit.

In various embodiments, the differential error amplifier includes a first input configured to receive a reference voltage and a second input configured to receive the single-ended envelope signal, and the second input has an input impedance that is lower than an input impedance of the first input.

In several embodiments, the envelope tracker further includes a switching regulator configured to generate a regulated voltage, and a combiner configured to combine the regulated voltage and the output current to thereby generate the power amplifier supply voltage. In accordance with some embodiments, the differential error amplifier is further configured to generate a sense signal that tracks the output current, and the switching regulator is configured to generate the regulated voltage based on the sense signal.

In certain embodiments, the present disclosure relates to a method of envelope tracking. The method includes amplifying a radio frequency signal having an envelope using a power amplifier, and generating a power amplifier supply voltage of the power amplifier using an envelope tracker. Generating the power amplifier supply voltage includes amplifying a differential envelope signal to generate a single-ended envelope signal that changes in relation to the envelope using a differential envelope amplifier, generating an output current by comparing the single-ended envelope signal to a reference signal using a differential error amplifier, and adjusting a voltage level of the power amplifier supply voltage using the output current.

In a number of embodiments, the method further includes amplifying the differential envelope signal using an amplification circuit of the differential envelope amplifier, and compensating the amplification circuit for a common mode error arising from a common mode voltage of the differential envelope signal using a common mode feedback circuit. According to various embodiments, the method further includes compensating the amplification circuit for the common mode error includes receiving the differential envelope signal at a first differential input of the amplification circuit, outputting the single-ended envelope signal at an output of the amplification circuit, and providing feedback from the output of the amplification circuit to a second differential input of the amplification circuit. In accordance with several embodiments, the method further includes filtering the differential envelope signal prior to amplifying the differential envelope signal using the amplification circuit.

In some embodiments, generating the power amplifier supply voltage further includes generating a regulated voltage using a switching regulator, and combining the regulated voltage and the output current to thereby generate the power amplifier supply voltage.

DETAILED DESCRIPTION OF EMBODIMENTS

Figure 1:
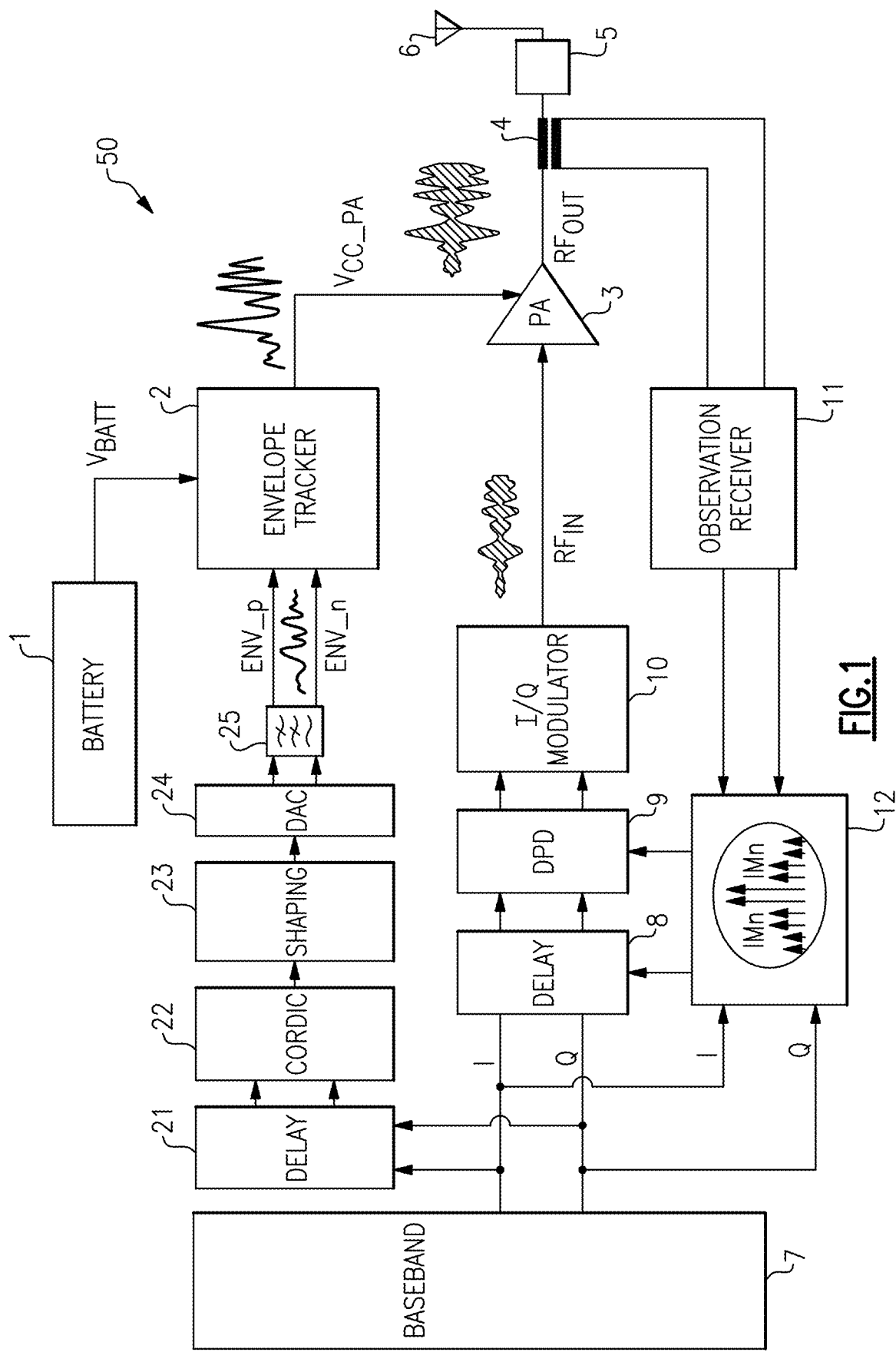
FIG. 1 is a schematic diagram of one embodiment of a communication system for transmitting radio frequency (RF) signals.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Envelope tracking is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

Fast envelope tracking systems for power amplifiers are provided herein. In certain embodiments, an envelope tracking system for a power amplifier includes a DC-to-DC converter and a differential error amplifier configured to operate in combination with one another to generate a power amplifier supply voltage for the power amplifier based on an envelope of an RF signal amplified by the power amplifier. The envelope tracking system further includes a differential envelope amplifier configured to amplify a differential envelope signal to generate a single-ended envelope signal that changes in relation to the envelope of the radio frequency signal. Additionally, the differential error amplifier generates an output current operable to adjust a voltage level of the power amplifier supply voltage based on comparing the single-ended envelope signal to a reference signal.

The differential envelope amplifier can operate in combination with the differential error amplifier to provide wide envelope tracking bandwidth, for instance, 180 MHz or more of modulation bandwidth.

In certain implementations, the differential envelope amplifier includes an amplification circuit configured to amplify the differential envelope signal, and a common mode feedback circuit operable to compensate the amplification circuit for a common mode error arising from a common mode voltage of the differential envelope signal.

Compensating the amplification circuit for common mode error can enhance the performance of the envelope tracking system by providing rejection to a common mode component of the differential envelope signal. For example, the differential envelope signal can be received from a transceiver over a relatively long connection that is susceptible to noise. By including a differential envelope amplifier with common mode error compensation, the envelope tracking system can operate with robust performance.

In certain implementations, the differential envelope amplifier includes an amplification circuit including a first differential input for receiving the differential envelope signal and a second differential input configured to receive a differential compensation signal from the common mode feedback circuit. Additionally, the common mode feedback circuit can provide feedback from an output of the amplification circuit to the second differential input to provide common mode error compensation.

To provide further noise rejection, the envelope tracker can further include a differential input filter for filtering the differential envelope signal prior to amplification by the amplification circuit.

In certain implementations, the differential error amplifier includes a pair of inputs of different input impedance to aid in providing fast tracking. For example, the differential error amplifier can include a first input with high input impedance that receives a reference voltage and a second input with low input impedance that receives the single-ended envelope signal.

Implementing the differential error amplifier in this manner can enhance envelope tracking speed. For example, the second input can source or sink a relatively large current to quickly charge or discharge internal capacitances of the differential error amplifier to provide a fast transient response. In contrast, when using an amplifier having a pair of inputs with high input impedance, a resistor-capacitor (RC) time constant associated with charging and discharging capacitances can be relatively large. Thus, such envelope trackers can operate with a delay that degrades the envelope tracking system's bandwidth.

In certain configurations, the second input of the differential error amplifier that receives the envelope signal can be of much lower input impedance the first input that receives the reference voltage. For example, the second input can connect to FET drain and/or source regions, while the first input can connect to a gate region of much higher impedance. In one example, an input impedance of the second input is at least ten times lower than an input impedance of the first input.

In certain implementations, the differential error amplifier also generates a sense signal, such as a sense current that tracks the output current. The sense current can be used in a variety of ways to enhance the performance of the envelope tracking system. For example, the DC-to-DC current can use the sense current in part to generate a regulated voltage, which is combined with the output current of the differential error amplifier to generate the power amplifier supply voltage.

FIG. 1 is a schematic diagram of one embodiment of a communication system 50 for transmitting RF signals. The communication system 50 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/Q modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25.

The communication system 50 of FIG. 1 illustrates one example of an RF system that can include an envelope tracking system implemented in accordance with one or more features of the present disclosure. However, the teachings herein are applicable to RF systems implemented in a wide variety of ways.

The baseband processor 7 operates to generate an in-phase (I) signal and a quadrature-phase (Q) signal, which correspond to signal components of a sinusoidal wave or signal of a desired amplitude, frequency, and phase. For example, the I signal and the Q signal provide an equivalent representation of the sinusoidal wave. In certain implementations, the I and Q signals are outputted in a digital format. The baseband processor 7 can be any suitable processor for processing baseband signals. For instance, the baseband processor 7 can include a digital signal processor, a microprocessor, a programmable core, or any combination thereof.

The signal delay circuit 8 provides adjustable delay to the I and Q signals to aid in controlling relative alignment between the differential envelope signal ENV_p, ENV_n provided to the envelope tracker 2 and the RF signal $RF_{IN}$ provided to the power amplifier 3. The amount of delay provided by the signal delay circuit 8 is controlled based on amount of intermodulation in adjacent bands detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the DPD provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3.

The I/Q modulator 10 receives the digitally pre-distorted I and Q signals, which are processed to generate the RF signal $RF_{IN}$. For example, the I/Q modulator 10 can include DACs configured to convert the digitally pre-distorted I and Q signals into an analog format, mixers for upconverting the analog I and Q signals to radio frequency, and a signal combiner for combining the upconverted I and Q signals into the RF signal $RF_{IN}$. In certain implementations, the I/Q modulator 10 can include one or more filters configured to filter frequency content of signals processed therein.

The envelope delay circuit 21 delays the I and Q signals from the baseband processor 7. Additionally, the CORDIC circuit 22 processes the delayed I and Q signals to generate a digital envelope signal representing an envelope of the RF signal $RF_{IN}$. Although FIG. 1 illustrates an implementation using the CORDIC circuit 22, an envelope signal can be obtained in other ways.

The shaping circuit 23 operates to shape the digital envelope signal to enhance the performance of the communication system 50. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to a differential analog envelope signal. Additionally, the differential analog envelope signal is filtered by the reconstruction filter 25 to generate a differential envelope signal ENV_p, ENV_n suitable for use by a differential envelope amplifier of the envelope tracker 2. In certain implementations, the reconstruction filter 25 includes a differential low pass filter.

With continuing reference to FIG. 1, the envelope tracker 2 receives the envelope signal from the reconstruction filter 25 and a battery voltage $V_{BATT}$ from the battery 1, and uses the differential envelope signal ENV_p, ENV_n to generate a power amplifier supply voltage $V_{CC\_PA}$ for the power amplifier 3 that changes in relation to the envelope of the RF signal $RF_{IN}$. The power amplifier 3 receives the RF signal $RF_{IN}$ from the I/Q modulator 10, and provides an amplified RF signal $RF_{OUT}$ to the antenna 6 through the duplexing and switching circuit 5, in this example.

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for providing down conversion to generate downconverted I and Q signals, and DACs for generating I and Q observation signals from the downconverted I and Q signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the differential envelope signal ENV_p, ENV_n and the RF signal $RF_{IN}$. In another embodiment, the intermodulation detection circuit 12 additionally or alternatively controls a delay of the signal delay circuit 21.

By including a feedback path from the output of the power amplifier 3 and baseband, the I and Q signals can be dynamically adjusted to optimize the operation of the communication system 50. For example, configuring the communication system 50 in this manner can aid in providing power control, compensating for transmitter impairments, and/or in performing DPD.

Although illustrated as a single stage, the power amplifier 3 can include one or more stages. Furthermore, the teachings herein are applicable to communication systems including multiple power amplifiers.

Figure 2A:
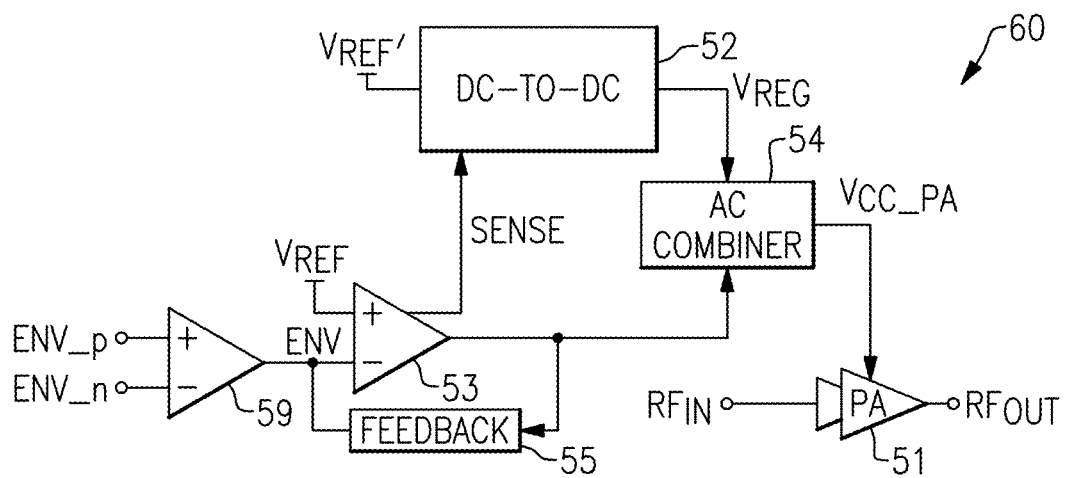
FIG. 2A is a schematic diagram of one embodiment of an envelope tracking system for a power amplifier.
Figure 2B:
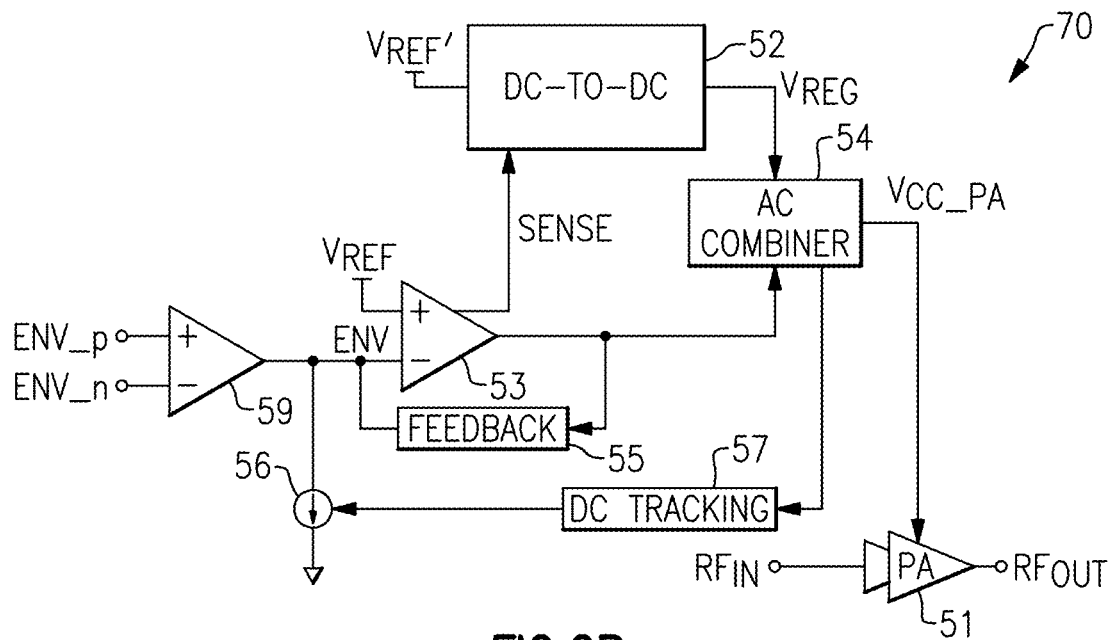
FIG. 2B is a schematic diagram of another embodiment of an envelope tracking system for a power amplifier.
Figure 3:
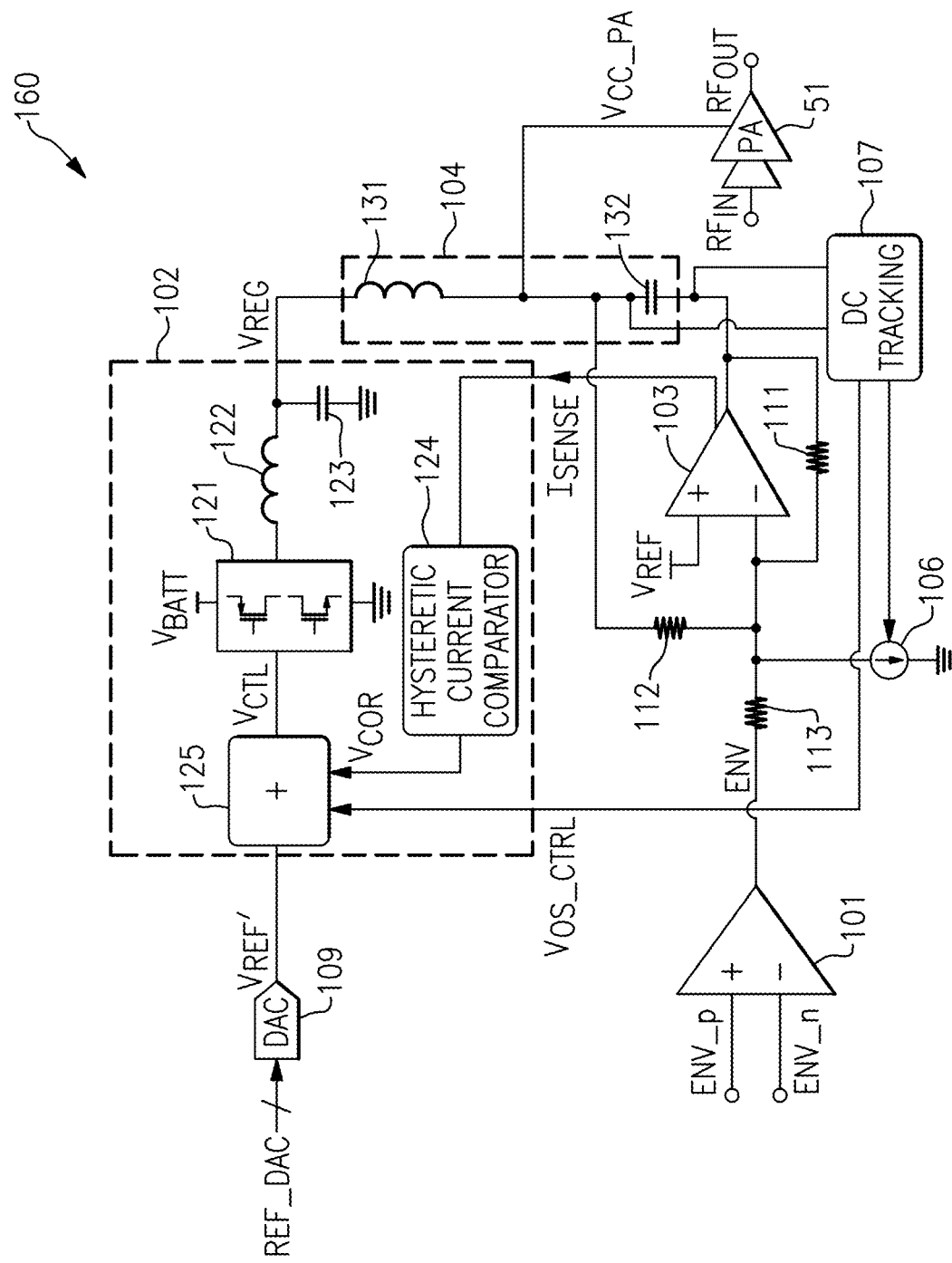
FIG. 3 is a schematic diagram of another embodiment of an envelope tracking system for a power amplifier.

FIGS. 2A, 2B, and 3 depict schematic diagram of various embodiments of envelope tracking systems for a power amplifier. The envelope tracking systems of these embodiments provide fast envelope tracking. However, the teachings herein are applicable to envelope trackers implemented in a wide variety of ways. Accordingly, other implementations are possible.

FIG. 2A is a schematic diagram of one embodiment of an envelope tracking system 60 for a power amplifier 51. The envelope tracking system 60 includes a DC-to-DC converter 52, a differential error amplifier 53, an AC combiner 54, a feedback circuit 55, and a differential envelope amplifier 59.

The power amplifier 51 amplifies an RF input signal $RF_{IN}$ to generate an RF output signal $RF_{OUT}$. The envelope tracking system 60 receives the differential envelope signal ENV_p, ENV_n, which changes in relation to an envelope of the RF input signal $RF_{IN}$.

The differential envelope amplifier 59 amplifies the differential envelope signal ENV_p, ENV_n to generate a single-ended envelope signal ENV that changes in relation to the envelope.

In the illustrated embodiment, the DC-to-DC converter 52 operates to generate a regulated voltage $V_{REG}$ based on a DC-to-DC reference voltage $V_{REF'}$ and a sense signal SENSE from the differential error amplifier 53. The DC-to-DC converter 52 can be implemented in a wide variety of ways including, but not limited to, using a buck converter, a boost converter, or a buck-boost converter. The DC-to-DC converter 52 is also referred to herein as a switching regulator.

The sense signal SENSE serves to track changes in the single-ended envelope signal ENV. For example, the sense signal SENSE can change in relation to an output current of the differential error amplifier 53. However, other implementations are possible.

The differential error amplifier 53 includes a first input that receives a reference voltage $V_{REF}$ and a second input that receives the single-ended envelope signal ENV from the differential envelope amplifier 59. In the illustrated embodiment, the first input is a non-inverting input and the second input is an inverting input. However, other implementations are possible. The differential error amplifier 53 is also referred to herein as a high bandwidth amplifier.

The differential error amplifier 53 further includes an output that is electrically connected to the second input via the feedback circuit 55. The feedback circuit 55 can be implemented in a wide variety of ways. In one example, the feedback circuit 55 includes at least one of a resistor or a capacitor, for instance, a parallel combination of a resistor and a capacitor.

The AC combiner 54 operates to combine the output of the DC-to-DC converter 52 and the output of the differential error amplifier 53 to generate a power amplifier supply voltage $V_{CC\_PA}$ for the power amplifier 51.

In certain implementations, the inverting input of the differential error amplifier 53 that receives the single-ended envelope signal ENV is implemented with lower input impedance relative to the non-inverting input that receives the reference voltage $V_{REF}$. For example, with respect to internal amplification circuitry of the differential error amplifier 53, the inverting input can connect to FET drain and/or source regions, while the non-inverting input can connect to a gate region of much higher impedance.

By providing the single-ended envelope signal ENV to a low impedance input, a relatively large current can be sourced or sunk as needed to quickly charge or discharge internal capacitances of the differential error amplifier 53. In contrast, when using a pair of inputs with high input impedance, an RC time constant associated with charging and discharging capacitances can be relatively large.

The illustrated envelope tracking system 60 also includes the differential envelope amplifier 59, which provides a number of advantages. For example, including the differential envelope amplifier 59 provides superior rejection of noise and/or higher gain for rapid envelope tracking. In certain implementations, the differential envelope amplifier 59 is further implemented with a common mode feedback circuit for reducing a common mode error arising from a common mode voltage of the differential envelope signal ENV_p, ENV_n.

Accordingly, the combination of the differential envelope amplifier 59 and differential error amplifier 53 can provide fast envelope tracking, for instance, 180 MHz or more of modulation bandwidth.

FIG. 2B is a schematic diagram of another embodiment of an envelope tracking system 70 for a power amplifier 51. The envelope tracking system 70 includes a DC-to-DC converter 52, a differential error amplifier 53, an AC combiner 54, a feedback circuit 55, a current source 56, a DC tracking circuit 57, and a differential envelope amplifier 59.

The envelope tracking system 70 of FIG. 2B is similar to the envelope tracking system 60 of FIG. 2A, except that the envelope tracking system 70 further includes the current source 56 and the DC tracking circuit 57.

The current source 56 is electrically connected to the second input of the differential error amplifier 53, and provides a current that is controlled by the DC tracking circuit 57. The DC tracking circuit 57 monitors the AC combiner 54, such as one or more internal currents and/or voltages, and adjusts the current of the current source 56 to maintain suitable DC biasing levels.

FIG. 3 is a schematic diagram of another embodiment of an envelope tracking system 160 for a power amplifier 51. The envelope tracking system 160 includes a differential envelope amplifier 101, a DC-to-DC converter 102, a differential error amplifier 103, an AC combiner 104, a current source 106, a DC tracking circuit 107, a DAC 109, a first feedback resistor 111, a second feedback resistor 112, and an input resistor 113.

The DC-to-DC converter 102 includes a switcher 121, an inductor 122, an output capacitor 123, a hysteretic current comparator 124, and a control voltage adder 125. The DAC 109 receives a digital reference signal REF_DAC, which controls a voltage of the DC-to-DC reference voltage $V_{REF'}$ generated by the DAC 109. In certain implementations, the digital reference signal REF_DAC is received over an interface, for instance, a serial bus such as the Mobile Industry Peripheral Interface (MIPI) Radio Frequency Front-End Control Interface (RFFE) bus 651 of FIG. 8.

The hysteretic current comparator 124 processes a sense current $I_{SENSE}$ from the differential error amplifier 103 to generate a correction voltage $V_{COR}$. The control voltage adder 125 adds the correction voltage $V_{COR}$, a DC tracking correction voltage from the DC tracking circuit 107, and the DC-to-DC reference voltage $V_{REF'}$ to generate a control voltage $V_{CTL}$ of the switcher 121. The switcher 121 receives a battery voltage $V_{BATT}$ and a ground voltage, and controls a current flowing through the inductor 122 over time to control a voltage level of a regulated voltage $V_{RE}G$ at the output of the DC-to-DC converter 102.

Including the hysteretic current comparator 124 aids in controlling the voltage level of the regulated voltage $V_{RE}G$ based on the sense current $I_{SENSE}$ so as to reduce an average output current of the differential envelope amplifier 103. Since the DC-to-DC converter 102 can have a higher efficiency than the differential error amplifier 103, reducing the average output current of the differential error amplifier 103 can improve the overall efficiency of the envelope tracking system 160.

The AC combiner 104 includes an inductor 131 and an AC coupling capacitor 132. As shown in FIG. 3, the inductor 131 is connected between the regulated voltage $V_{REG}$ and the power amplifier supply voltage $V_{CC\_PA}$, and the AC coupling capacitor 132 is connected between the power amplifier supply voltage $V_{CC\_PA}$ and the output of the differential error amplifier 103.

In the illustrated embodiment, the first feedback resistor 111 is connected between the output and inverting input of the differential error amplifier 103. Additionally, the second feedback resistor 112 is connected between the power amplifier supply voltage $V_{CC\_PA}$ and the inverting input of the differential error amplifier 103. Although one example of feedback for a differential envelope amplifier is shown, a wide variety of implementations of feedback can be used.

With continuing reference to FIG. 3, the envelope signal ENV is provided to the inverting input of the differential error amplifier 103 via the input resistor 113. Additionally, the non-inverting input of the differential error amplifier 103 receives the reference voltage $V_{REF}$. The differential error amplifier 103 generates an output current, which is provided to the power amplifier supply voltage $V_{CC\_PA}$ via the capacitor 132 to provide voltage level adjustment to the power amplifier supply voltage $V_{CC\_PA}$. In the illustrated embodiment, the differential error amplifier 103 also generates the sense current $I_{SENSE}$, which changes in relation to the amplifier's output current.

In certain implementations, the inverting input of the differential error amplifier 103 that receives the single-ended envelope signal ENV is implemented with lower input impedance relative to the non-inverting input that receives the reference voltage $V_{REF}$. Thus, the differential error amplifier 103 provides fast envelope tracking.

The current source 106 is electrically connected between the inverting input of the differential error amplifier 103 and ground. The DC tracking circuit 107 controls a current of the current source 106 based on a voltage across the capacitor 132. In particular, the DC tracking circuit 107 controls the current to maintain the voltage across the capacitor 132 relatively constant, thereby helping to maintain sufficient voltage headroom and suitable DC biasing at the output of the differential error amplifier 103.

In certain implementations, the DC tracking circuit 107 serves to control the current of the current source 106 such that the voltage across the capacitor 132 is about equal to a desired voltage, such as a reference voltage. Thus, the DC tracking circuit 107 adjusts the current of the current source 106 to provide DC tracking. As shown in FIG. 3, the DC tracking circuit 107 also provides a DC tracking correction voltage to the DC-to-DC converter 102, in certain implementations.

Figure 4:
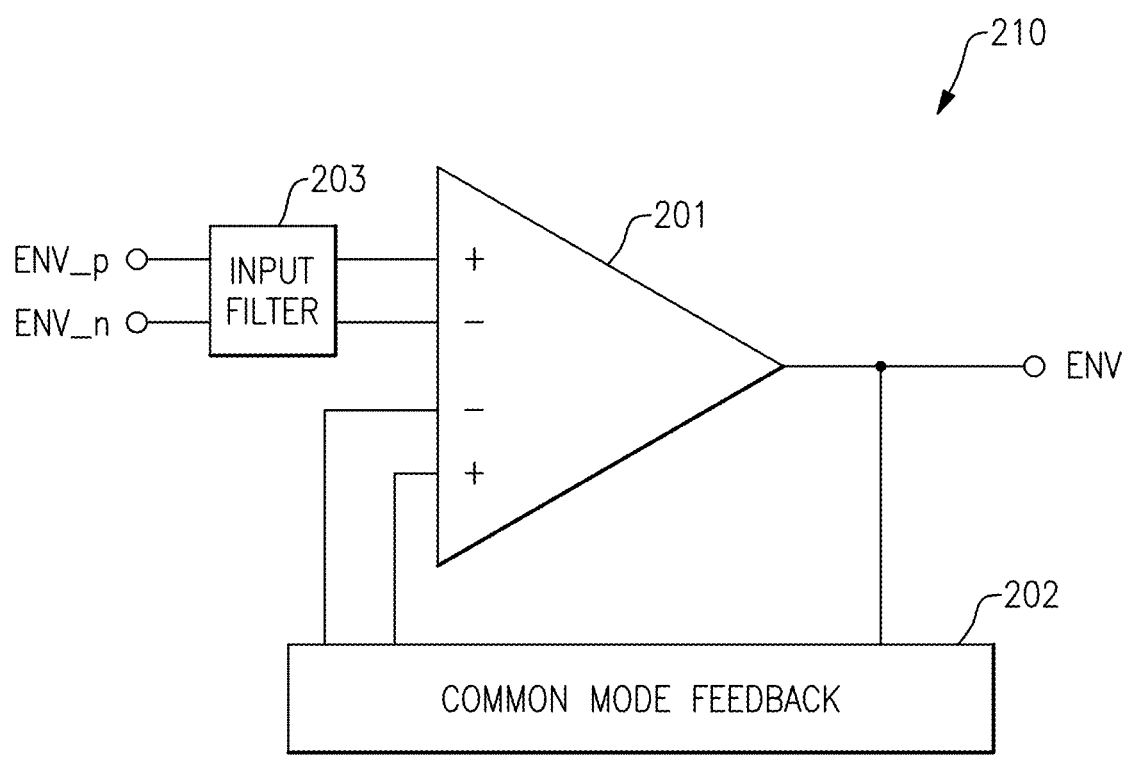
FIG. 4 is a schematic diagram of one embodiment of a differential envelope amplifier for an envelope tracking system.

FIG. 4 is a schematic diagram of one embodiment of a differential envelope amplifier 210 for an envelope tracking system. The differential envelope amplifier 210 includes an amplification circuit 201, a common mode feedback circuit 202, and a differential input filter 203.

The differential envelope amplifier 210 of FIG. 4 illustrates one embodiment of the differential envelope amplifier of FIGS. 2A-3. Although one example of a differential envelope amplifier is shown, the differential envelope amplifier of FIGS. 2A-3 can be implemented in other ways.

The differential input filter 203 receives a differential envelope signal ENV_p, ENV_n, and filters the differential envelope signal to generate a filtered differential envelope signal.

The amplification circuit 201 includes a first differential input that receives the filtered differential envelope signal from the differential input filter 203 and a second differential input that receives a differential compensation signal from the common mode feedback circuit 202. The amplification circuit 201 includes an output that generates a single-ended envelope signal ENV.

As shown in FIG. 4, the common mode feedback circuit 202 is connected between the output of the amplification circuit 201 and the second differential input of the amplification circuit 201. The common mode feedback circuit 202 provides single-ended to differential signal conversion, in this example.

The common mode feedback circuit 202 provides feedback that compensates the amplification circuit 201 for an error arising from a common mode voltage of the differential envelope signal ENV_p, ENV_n.

Figure 5:
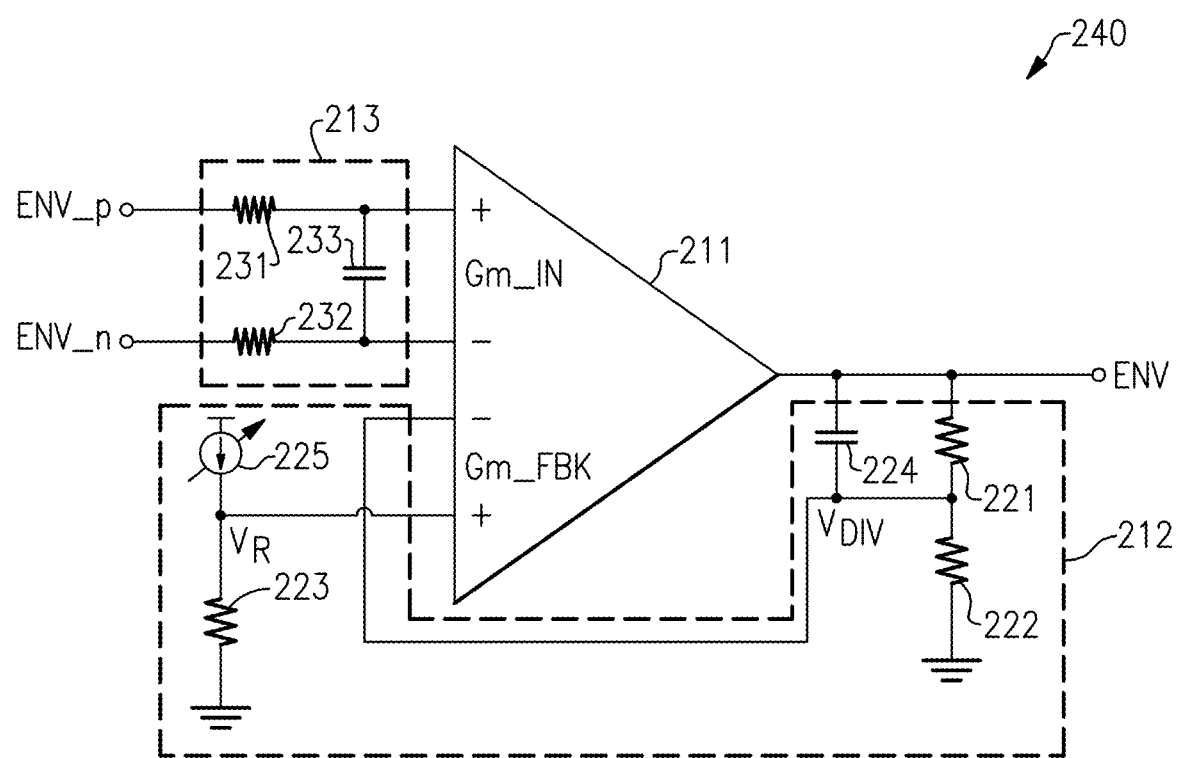
FIG. 5 is a schematic diagram of another embodiment of a differential envelope amplifier for an envelope tracking system.

FIG. 5 is a schematic diagram of one embodiment of a differential envelope amplifier 240 for an envelope tracking system. The differential envelope amplifier 240 includes an amplification circuit 211, a common mode feedback circuit 212, and a differential input filter 213.

The differential envelope amplifier 240 of FIG. 5 is similar to the differential envelope amplifier 210 of FIG. 4, except that the differential envelope amplifier 240 includes specific implementations of circuitry. Although one example of circuitry is shown, a differential envelope amplifier can be implemented in other ways.

In the illustrated embodiment, the amplification circuit 211 includes a first differential input, a second differential input, and an output. The first differential input is a voltage input associated with a first transconductance Gm_IN, and the second differential input is a voltage input associated with a second transconductance Gm_FBK. In certain implementations, Gm_IN is greater than Gm_FBK.

With continuing reference to FIG. 5, the common mode feedback circuit 212 includes a first resistor 221 and a second resistor 222, which operate as a voltage divider that generates a divided voltage \how. The first resistor 221 and the second resistor 222 are connected in series between the output of the amplification circuit 211 and a reference voltage, such as ground. The common mode feedback circuit 212 includes a capacitor 224 in parallel with the first resistor 221. The common mode feedback circuit 212 further includes a third resistor 223 and a current source 225 connected in series between a supply voltage and ground. The second differential input of the amplification circuit 221 compares a voltage $V_R$ across the third resistor 223 to the divided voltage $V_{DIV}$ generated by the first and second resistor 221, 222. In certain implementations the current source 225 is controllable (for instance, variable and/or programmable) to control a common mode setting of the common mode feedback circuit 212.

The common mode feedback circuit 212 operates to provide feedback that controls an output DC bias point or level of the amplification circuit 211, thereby reducing or eliminating an impact of a common mode voltage of the differential envelope signal ENV_P, ENV_n.

In the illustrated embodiment, the differential input filter 213 includes a first filter resistor 231, a second filter resistor 232, and a filter capacitor 233. The differential input filter 213 provides low pass filtering to the differential envelope signal ENV_p, ENV_n, and provides the filtered differential envelope signal to the first differential input of the amplification circuit 211.

Figure 6:
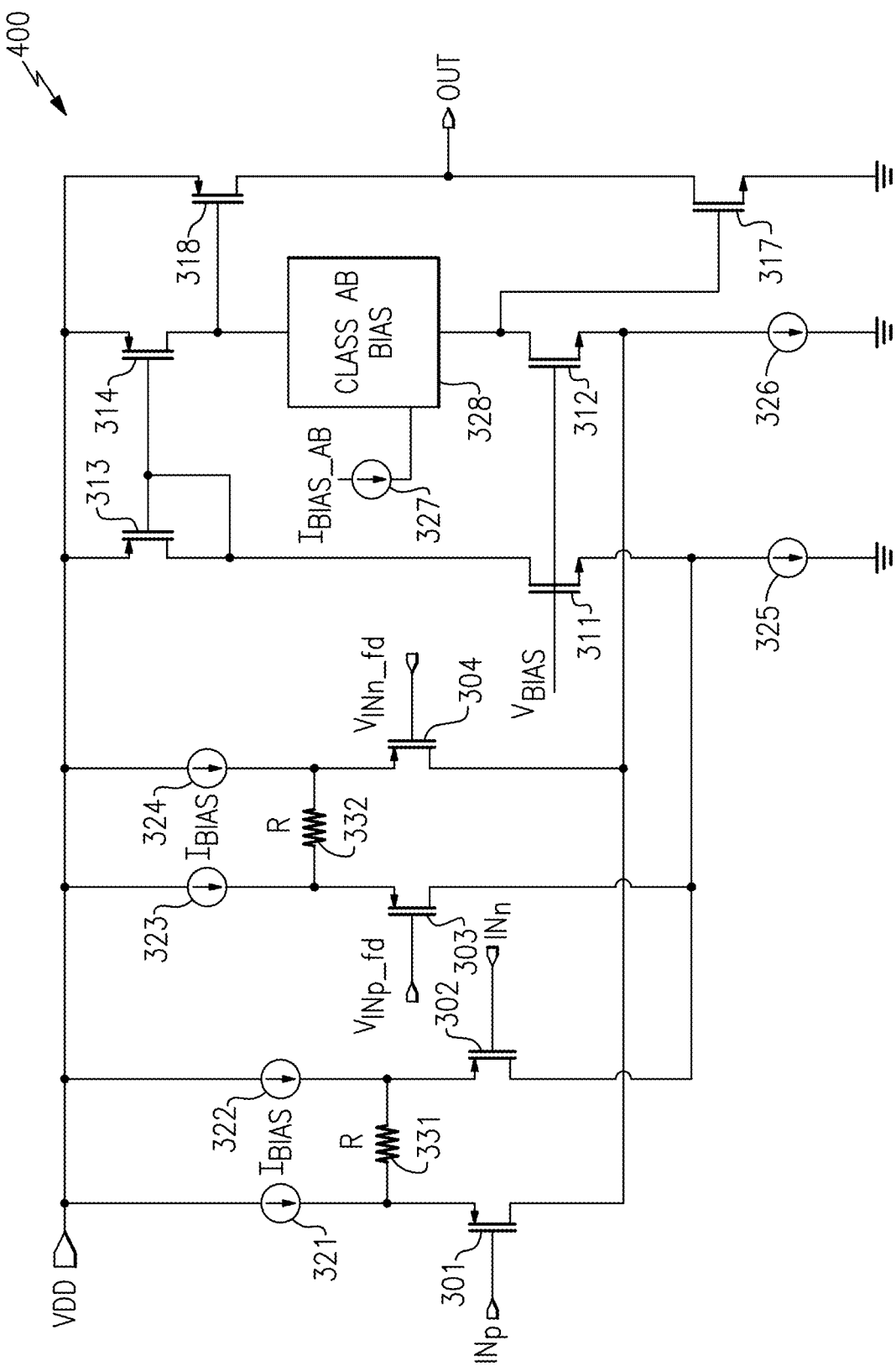
FIG. 6 is a schematic diagram of one embodiment of an amplification circuit for the differential envelope amplifiers of FIGS. 4 and 5.

FIG. 6 is a schematic diagram of one embodiment of an amplification circuit 400 for the differential envelope amplifiers of FIGS. 4 and 5. Although one example of a suitable amplification circuit is shown, a differential envelope amplifier can include amplification circuitry implemented in a wide variety of ways.

As shown in FIG. 6, the differential amplification circuit 400 includes a first pair of p-type field effect transistors (PFETs) 301-302 for amplifying a first differential input $IN_p$, $IN_n$. The first pair of PFETs 301-302 is biased by a first pair of current sources 321-322 (each providing a current $I_{BIAS}$, in this example), and includes a first resistor 331 of resistance R for coupling the source of the PFET 301 to the source of the PFET 302. The differential amplification circuit 400 further includes a second pair of PFETs 303-304 for amplifying a second differential input $V_{INp\_fd}$, $V_{INn\_fd}$, corresponding to a differential common mode compensation signal. The second pair of PFETs 303-304 is biased by a second pair of current sources 323-324 (also providing a current $I_{BIAS}$, in this example), and includes a second resistor 332 (also of resistance R, in this example) for coupling the source of the PFET 303 to the source of the PFET 304.

Currents from the first pair of PFETs 301-302 and the second pair of PFETs 303-304 are combined using folded cascode circuitry that includes current sources 325-326, n-type field effect transistors (NFETs) 311-312, and PFETs 313-314. In this example, the gates of NFETs 311-312 are controlled by a bias voltage VBIAS.

The amplification circuit 400 further includes a push-pull output stage including NFET 317, PFET 318, a current source 327, and a class AB bias circuit 328. As shown in FIG. 6, the current source 327 provides a current $I_{BIAS\_AB}$ to the class AB bias circuit 328, which biases the NFET 317 and PFET 318 to provide enhanced bandwidth.

Figure 7A:
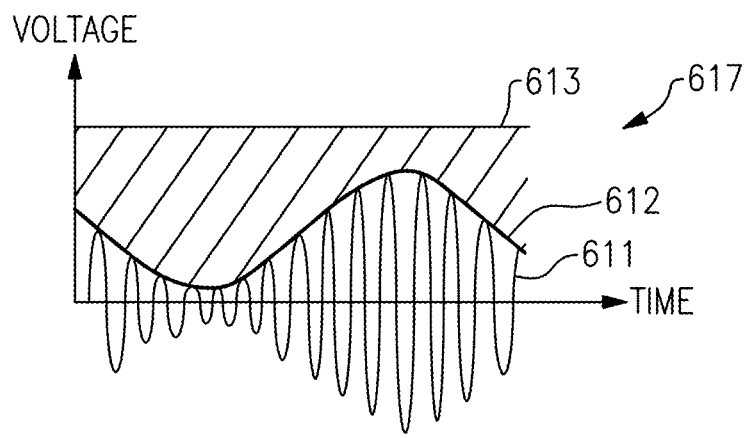
FIG. 7A is a graph showing a first example of power amplifier supply voltage versus time.

FIG. 7A is a graph 617 showing a first example of power amplifier supply voltage versus time. The graph 617 illustrates the voltage of an RF signal 611, the RF signal's envelope 612, and a power amplifier supply voltage 613 versus time. The graph 617 corresponds to one example of waveforms for an implementation in which the power amplifier supply voltage 613 is substantially fixed.

It can be important that the power amplifier supply voltage 613 of a power amplifier has a voltage greater than that of the RF signal 611. For example, powering a power amplifier using a power amplifier supply voltage that has a magnitude less than that of the RF signal can clip the RF signal, thereby creating signal distortion and/or other problems. Thus, it can be important the power amplifier supply voltage 613 be greater than that of the envelope 612. However, it can be desirable to reduce a difference in voltage between the power amplifier supply voltage 613 and the envelope 612 of the RF signal 611, as the area between the power amplifier supply voltage 613 and the envelope 612 can represent lost energy, which can reduce battery life and increase heat generated in a wireless device.

Figure 7B:
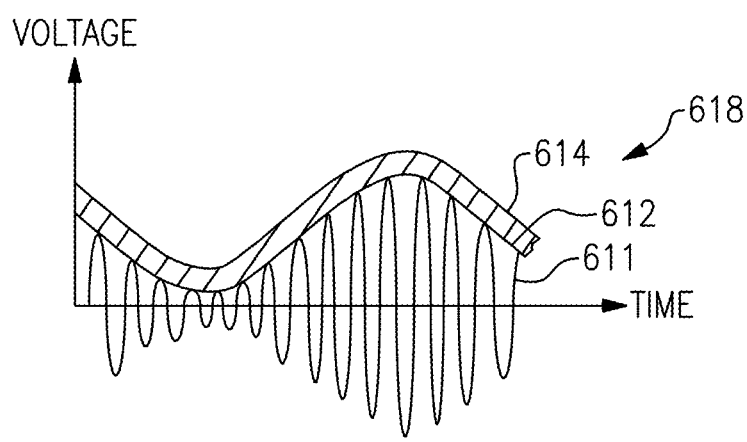
FIG. 7B is a graph showing a second example of power amplifier supply voltage versus time.

FIG. 7B is a graph 618 showing a second example of power amplifier supply voltage versus time. The graph 618 illustrates the voltage of an RF signal 611, the RF signal's envelope 612, and a power amplifier supply voltage 614 versus time. The graph 618 corresponds to one example of waveforms for an implementation in which the power amplifier supply voltage 614 is generated by envelope tracking.

In contrast to the power amplifier supply voltage 613 of FIG. 7A, the power amplifier supply voltage 614 of FIG. 7B changes in relation to the envelope 612 of the RF signal 611. The area between the power amplifier supply voltage 614 and the envelope 612 in FIG. 7B is less than the area between the power amplifier supply voltage 613 and the envelope 612 in FIG. 7A, and thus the graph 618 of FIG. 7B can be associated with an envelope tracking system having greater energy efficiency.

Figure 8:
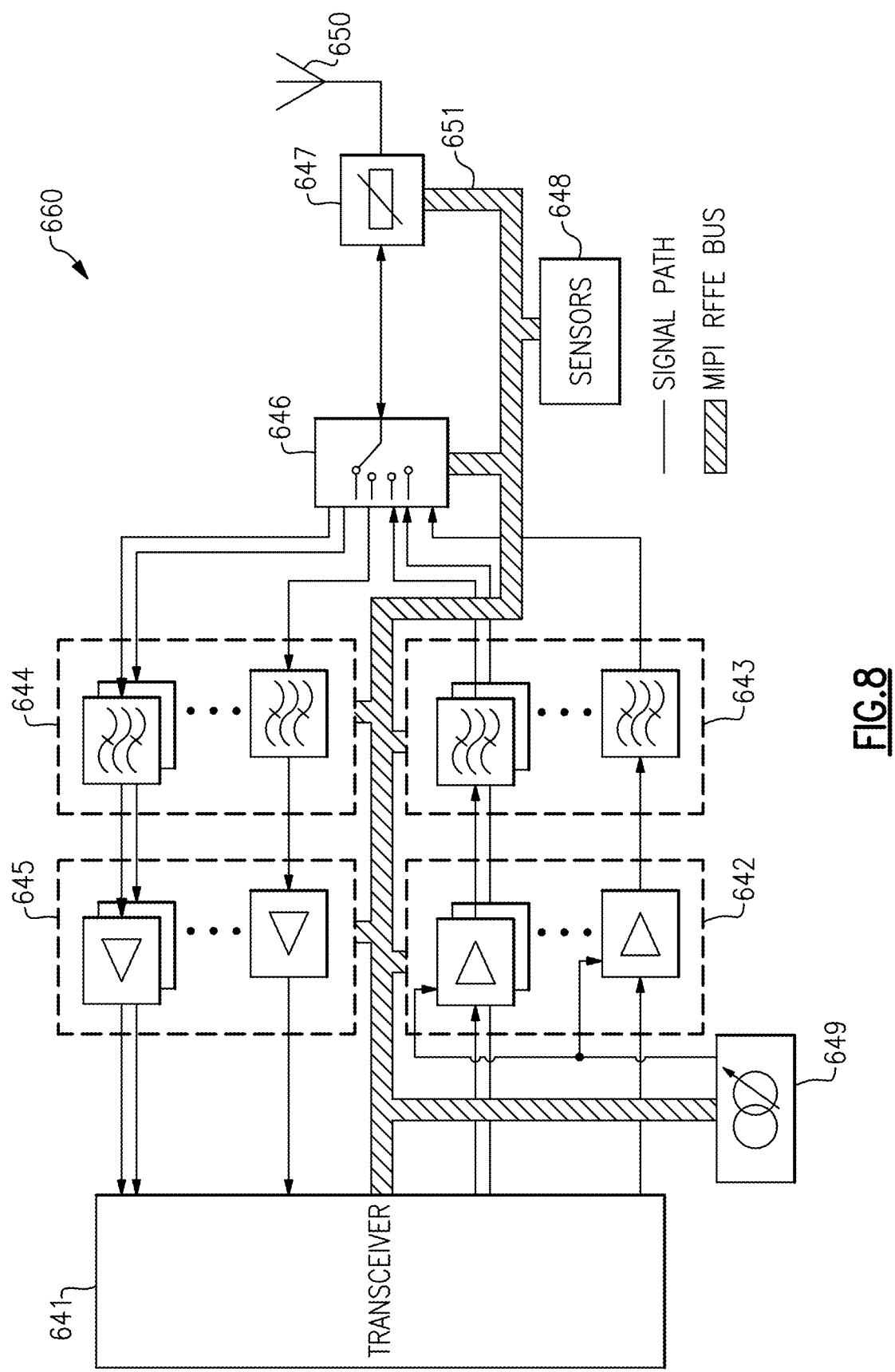
FIG. 8 is a schematic diagram of another embodiment of a communication system.

FIG. 8 is a schematic diagram of another embodiment of a communication system 660. The communication system 660 includes a transceiver 641, a power amplifier module 642, a transmit filter module 643, a receive filter module 644, a low noise amplifier (LNA) module 645, an antenna switch module 646, a coupler module 647, a sensor module 648, a power management module 649, an antenna 650, and a MIPI RFFE bus 651.

As shown in FIG. 8, various components of the communication system 660 are interconnected by the MIPI RFFE bus 651. Additionally, the transceiver 641 includes a master device of the MIPI RFFE bus 651, and each of the RF components includes a slave device of the MIPI RFFE bus 651. The master device of the transceiver 641 sends control commands over the MIPI RFFE bus 651 to configure the communication system 660 during initialization and/or while operational.

The power amplifier module 642 can include one or more power amplifiers. As shown in FIG. 8, the power amplifier module 642 receives one or more power amplifier supply voltages from the power management module 649. The power management module 649 can include an envelope tracker that generates at least one power amplifier supply voltage, and that is implemented in accordance with the teachings herein.

Although FIG. 8 illustrates one example of a communication system including a power management module and a power amplifier module, the teachings herein are applicable to communication systems implemented in a wide variety of ways.

Figure 9A:
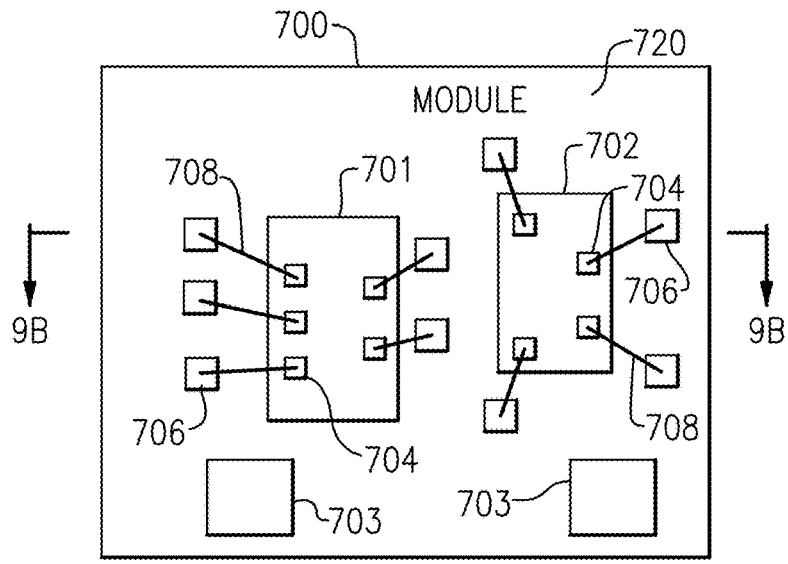
FIG. 9A is a schematic diagram of one embodiment of a packaged module.
Figure 9B:
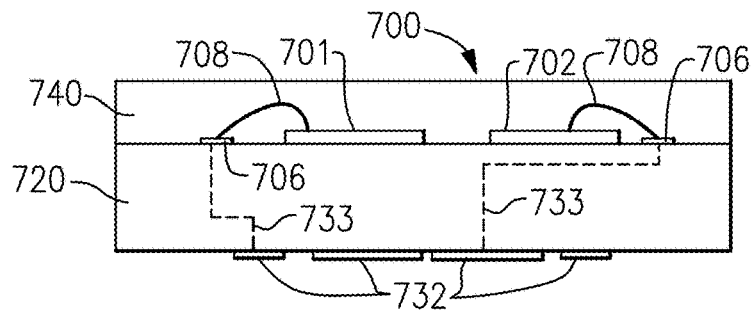
FIG. 9B is a schematic diagram of a cross-section of the packaged module of FIG. 9A taken along the lines 9B-9B.

FIG. 9A is a schematic diagram of one embodiment of a packaged module 700. FIG. 9B is a schematic diagram of a cross-section of the packaged module 700 of FIG. 9A taken along the lines 9B-9B. The packaged module 700 illustrates an example of a module that can include circuitry implemented in accordance with one or more features of the present disclosure.

The packaged module 700 includes a first die 701, a second die 702, surface mount components 703, wirebonds 708, a package substrate 720, and encapsulation structure 740. The package substrate 720 includes pads 706 formed from conductors disposed therein. Additionally, the dies 701, 702 include pads 704, and the wirebonds 708 have been used to connect the pads 704 of the dies 701, 702 to the pads 706 of the package substrate 720.

In certain implementations, the dies 701, 702 are manufactured using different processing technologies. In one example, the first die 701 is manufactured using a compound semiconductor process, and the second die 702 is manufactured using a silicon process. Although an example with two dies is shown, a packaged module can include more or fewer dies.

The packaging substrate 720 can be configured to receive a plurality of components such as the dies 701, 702 and the surface mount components 703, which can include, for example, surface mount capacitors and/or inductors.

As shown in FIG. 9B, the packaged module 700 is shown to include a plurality of contact pads 732 disposed on the side of the packaged module 700 opposite the side used to mount the dies 701, 702. Configuring the packaged module 700 in this manner can aid in connecting the packaged module 700 to a circuit board such as a phone board of a wireless device. The example contact pads 732 can be configured to provide RF signals, bias signals, ground, and/or supply voltage(s) to the dies 701, 702 and/or the surface mount components 703. As shown in FIG. 9B, the electrically connections between the contact pads 732 and the dies 701, 702 can be facilitated by connections 733 through the package substrate 720. The connections 733 can represent electrical paths formed through the package substrate 720, such as connections associated with vias and conductors of a multilayer laminated package substrate.

In some embodiments, the packaged module 700 can also include one or more packaging structures to, for example, provide protection and/or facilitate handling of the packaged module 700. Such a packaging structure can include overmold or encapsulation structure 740 formed over the packaging substrate 720 and the components and die(s) disposed thereon.

It will be understood that although the packaged module 700 is described in the context of electrical connections based on wirebonds, one or more features of the present disclosure can also be implemented in other packaging configurations, including, for example, flip-chip configurations.

Figure 10:
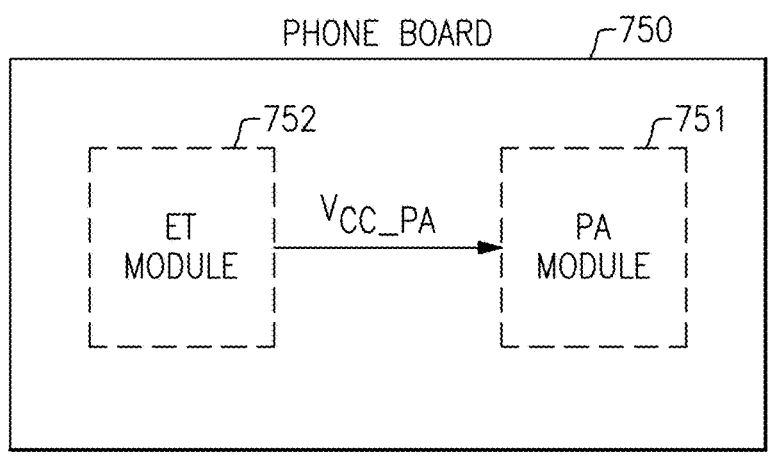
FIG. 10 is a schematic diagram of one embodiment of a phone board.

FIG. 10 is a schematic diagram of one embodiment of a phone board 750. The phone board 750 includes an envelope tracking module 752 and a power amplifier module 751 attached thereto. In certain configurations, the power amplifier module 751 and/or the envelope tracking module 752 are implemented using a module similar to that of the module 700 shown in FIGS. 9A-9B. As shown in FIG. 10, the envelope tracking module 752 provides a power amplifier supply voltage $V_{CC\_PA}$ to the power amplifier module 751. Additionally, the envelope tracking module 752 controls the power amplifier supply voltage $V_{CC\_PA}$ to change in relation to the envelope of an RF signal amplified by the power amplifier module 751.

Although not illustrated in FIG. 10 for clarity, the phone board 750 typically includes additional components and structures.

Figure 11:
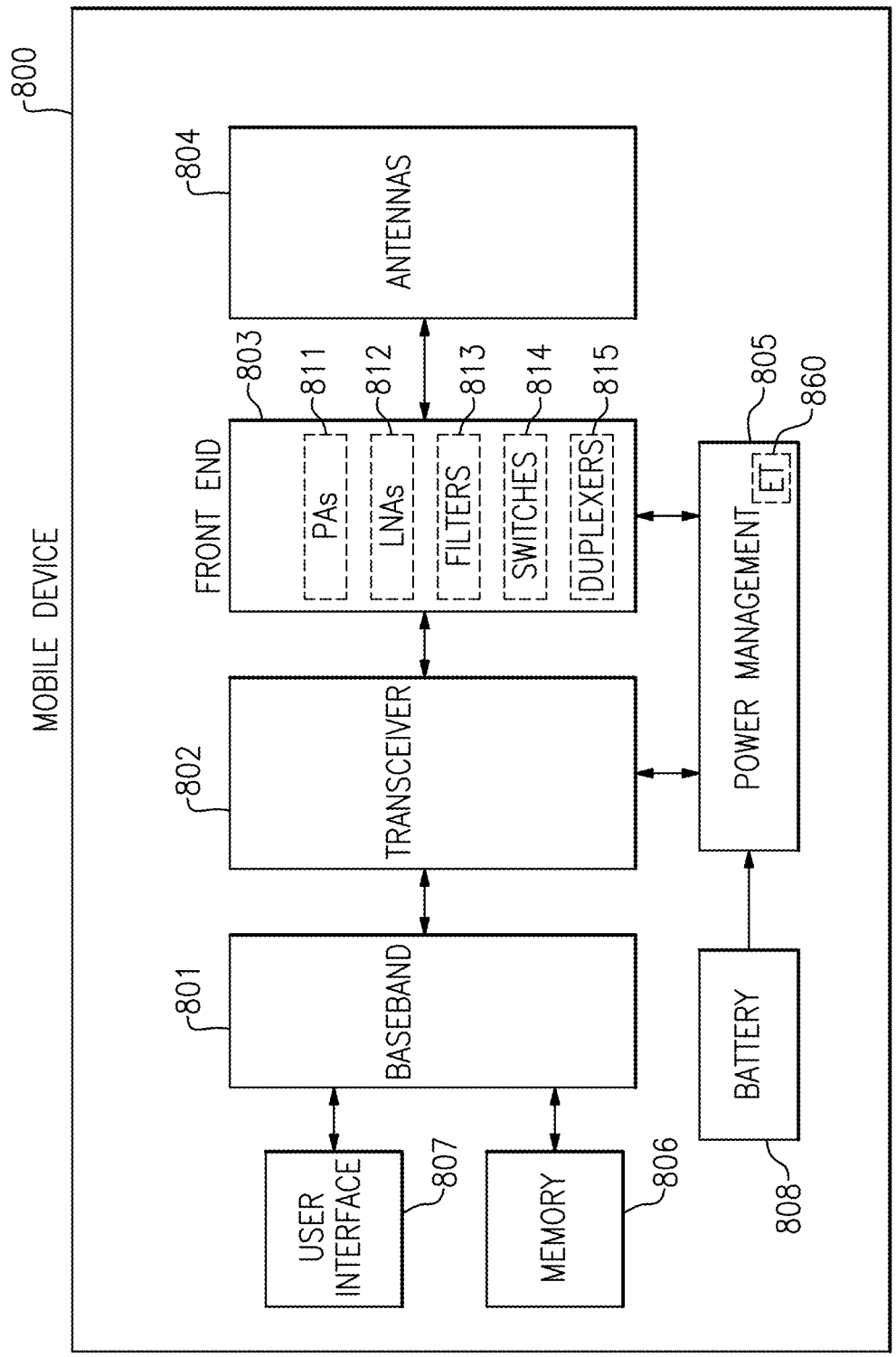
FIG. 11 is a schematic diagram of one embodiment of a mobile device.

FIG. 11 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an envelope tracker 860 implemented in accordance with one or more features of the present disclosure.

As shown in FIG. 11, the power management system 805 receives a battery voltage form the battery 808. The battery 808 can be any suitable battery for use in the mobile device 800, including, for example, a lithium-ion battery.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An envelope tracking system for a mobile device, the envelope tracking system comprising:
a power amplifier configured to amplify a radio frequency signal, the power amplifier powered by a power amplifier supply voltage; and
an envelope tracker configured to generate the power amplifier supply voltage based on an envelope of the radio frequency signal indicated by a differential envelope signal, the envelope tracker including a differential input filter configured to filter the differential envelope signal to generate a filtered differential envelope signal, the differential input filter includes a first resistor connected between a non-inverting input and a non-inverting output, a second resistor connected between an inverting input and an inverting output, and a capacitor connected between the non-inverting output and the inverting output, an amplification circuit configured to amplify the filtered differential envelope signal to generate a single-ended envelope signal, and a differential error amplifier configured to adjust a voltage level of the power amplifier supply voltage based on a difference between the single-ended envelope signal and a reference voltage.

2. The envelope tracking system of claim 1 wherein the differential input filter is a low pass filter.

3. The envelope tracking system of claim 1 further comprising a switching regulator configured to generate a regulated voltage, and a combiner configured to combine an output current of the differential error amplifier and the regulated voltage to generate the power amplifier supply voltage.

4. The envelope tracking system of claim 3 wherein the differential error amplifier is further configured to provide a sense current to the switching regulator, the sense current configured to change in relation to the output current.

5. The envelope tracking system of claim 1 wherein the amplification circuit includes a first differential input configured to receive the differential envelope signal, an output that provides the single-ended envelope signal, and a second differential input, the envelope tracker further including a common-mode feedback circuit connected between the output and the second differential input.

6. The envelope tracking system of claim 5 wherein the common-mode feedback circuit includes a voltage divider connected between the output of the amplification circuit and ground and configured to generate a divided voltage, the second differential input receiving a voltage difference between a controllable voltage and the divided voltage.

7. The envelope tracking system of claim 6 wherein the common-mode feedback circuit further includes a controllable current source and a resistor in series and configured to generate the controllable voltage.

8. The envelope tracking system of claim 1 wherein the differential error amplifier includes a first input configured to receive the reference voltage and a second input configured to receive the singled-ended envelope, the second input having lower input impedance than the first input to thereby widen envelope tracking bandwidth.

9. A method of envelope tracking in a mobile device, the method comprising:
generating a radio frequency signal using a transceiver;
amplifying the radio frequency signal using a power amplifier; and
generating a power amplifier supply voltage of the power amplifier based on an envelope of the radio frequency signal indicated by a differential envelope signal, including filtering the differential envelope signal to generate a filtered differential envelope signal using a differential input filter, the differential input filter includes a first resistor connected between a non-inverting input and a non-inverting output, a second resistor connected between an inverting input and an inverting output, and a capacitor connected between the non-inverting output and the inverting output, amplifying the filtered differential envelope signal to generate a single-ended envelope signal using an amplification circuit, and adjusting a voltage level of the power amplifier supply voltage based on a difference between the single-ended envelope signal and a reference voltage using a differential error amplifier.

10. The method of claim 9 further comprising generating a regulated voltage using a switching regulator, and combining an output current of the differential error amplifier and the regulated voltage to generate the power amplifier supply voltage using a combiner.

11. The method of claim 9 further comprising receiving the differential envelope signal at a first differential input of the amplification circuit, providing the single-ended envelope signal at an output of the amplification circuit, and using a common-mode feedback circuit to provide feedback from the output to a second differential input of the amplification circuit.

12. The method of claim 11 wherein using the common-mode feedback circuit to provide feedback includes using a voltage divider to generate a divided voltage based on a voltage of the output of the amplification circuit, and controlling the second differential input based on a voltage difference between a controllable voltage and the divided voltage.

13. A mobile device comprising:
a transceiver configured to generate a radio frequency signal;
a front end system including a power amplifier powered by a power amplifier supply voltage and operable to amplify the radio frequency signal; and
a power management system including an envelope tracker configured to generate the power amplifier supply voltage based on an envelope of the radio frequency signal indicated by a differential envelope signal, the envelope tracker including a differential input filter configured to filter the differential envelope signal to generate a filtered differential envelope signal, the differential input filter includes a first resistor connected between a non-inverting input and a non-inverting output, a second resistor connected between an inverting input and an inverting output, and a capacitor connected between the non-inverting output and the inverting output, an amplification circuit configured to amplify the filtered differential envelope signal to generate a single-ended envelope signal, and a differential error amplifier configured to adjust a voltage level of the power amplifier supply voltage based on a difference between the single-ended envelope signal and a reference voltage.

14. The mobile device of claim 13 wherein the differential input filter is a low pass filter.

15. The mobile device of claim 13 wherein the power management system further includes a switching regulator configured to generate a regulated voltage, and a combiner configured to combine an output current of the differential error amplifier and the regulated voltage to generate the power amplifier supply voltage.

16. The mobile device of claim 15 wherein the differential error amplifier is further configured to provide a sense current to the switching regulator, the sense current configured to change in relation to the output current.

17. The mobile device of claim 13 wherein the amplification circuit includes a first differential input configured to receive the differential envelope signal, an output that provides the single-ended envelope signal, and a second differential input, the envelope tracker further including a common-mode feedback circuit connected between the output and the second differential input.

18. The mobile device of claim 17 wherein the common-mode feedback circuit includes a voltage divider connected between the output of the amplification circuit and ground and configured to generate a divided voltage, the second differential input receiving a voltage difference between a controllable voltage and the divided voltage.

19. The mobile device of claim 18 wherein the common-mode feedback circuit further includes a controllable current source and a resistor in series and configured to generate the controllable voltage.

20. The mobile device of claim 13 wherein the differential error amplifier includes a first input configured to receive the reference voltage and a second input configured to receive the singled-ended envelope signal, the second input having lower input impedance than the first input to thereby widen envelope tracking bandwidth.

* * * * *